United States Patent
Reyzin et al.

(10) Patent No.: US 7,077,189 B1
(45) Date of Patent: Jul. 18, 2006

(54) LIQUID COOLED THERMOSIPHON WITH FLEXIBLE COOLANT TUBES

(75) Inventors: Ilya Reyzin, Williamsville, NY (US); Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/040,321

(22) Filed: Jan. 21, 2005

(51) Int. Cl.
*F28D 15/00* (2006.01)
*F28F 7/00* (2006.01)

(52) U.S. Cl. .................... 165/80.4; 165/83; 165/104.21

(58) Field of Classification Search ........... 165/104.14, 165/104.21, 104.27, 104.33, 81–83, 80.4; 361/699, 700; 257/714–715; 174/15.2
See application file for complete search history.

(56) References Cited

U.S. PATENT DOCUMENTS

| | | | | |
|---|---|---|---|---|
| 2,083,611 A * | 6/1937 | Marshall | ...................... | 165/286 |
| 3,415,315 A * | 12/1968 | Donaldson et al. | ......... | 165/148 |
| 3,511,310 A * | 5/1970 | Coenraad | ............... | 165/104.27 |
| 3,906,261 A * | 9/1975 | Ogura et al. | .................... | 310/12 |
| 4,020,399 A * | 4/1977 | Suzuki et al. | ................ | 361/700 |
| 4,138,692 A | 2/1979 | Meeker et al. | ............... | 257/697 |
| 4,153,921 A * | 5/1979 | Kresge et al. | ................. | 361/40 |
| 4,173,996 A * | 11/1979 | Pierce | .................... | 165/104.27 |
| 4,246,597 A * | 1/1981 | Cole et al. | ................... | 257/713 |
| 4,260,014 A * | 4/1981 | Feehan | ................... | 165/104.21 |
| 4,620,900 A * | 11/1986 | Kimura et al. | .............. | 202/172 |
| 4,704,658 A | 11/1987 | Yokouchi | ..................... | 361/385 |
| 5,150,274 A * | 9/1992 | Okada et al. | ................ | 361/703 |
| 5,198,889 A | 3/1993 | Hisano et al. | .............. | 257/678 |
| 5,304,846 A | 4/1994 | Azar | ........................... | 257/722 |
| 5,529,115 A | 6/1996 | Patterson | ............... | 165/104.33 |
| 5,704,416 A | 1/1998 | Larson | .................... | 165/104.33 |
| 6,062,302 A | 5/2000 | Davis et al. | ........... | 165/104.26 |
| 6,410,982 B1 | 6/2002 | Brownell et al. | ........... | 257/714 |
| 6,422,307 B1 | 7/2002 | Bhatti | ......................... | 165/185 |
| 6,808,015 B1 | 10/2004 | Osakabe | ................ | 165/104.25 |
| 2003/0034148 A1 | 2/2003 | Oyamada | ..................... | 165/46 |

* cited by examiner

*Primary Examiner*—Tho Duong
(74) *Attorney, Agent, or Firm*—Patrick M. Griffin

(57) ABSTRACT

A fluid heat exchanger assembly cools an electronic device with a cooling fluid supplied from a heat extractor (R, F) to a plurality of tubes extending between header tanks in an upper portion of a housing. A refrigerant is disposed in the lower portion of the housing for liquid-to-vapor transformation. The tubes are radially flexible to vary the volume of the tubes for modulating the flow of coolant liquid through the tubes in response to heat transferred by an electronic device to the lower portion of the housing.

8 Claims, 2 Drawing Sheets

LIQUID COOLED THERMOSIPHON WITH FLEXIBLE COOLANT TUBES

RELATED APPLICATIONS

The subject invention is related to the inventions disclosed in co-pending applications DP-311409 (H&H 60408-566) and DP-312789 (H&H 60408-597), filed concurrently herewith.

BACKGROUND OF THE INVENTION

1. Field of the Invention

A fluid heat exchanger assembly for cooling an electronic device.

2. Description of the Prior Art

Research activities have focused on developing assemblies to efficiently dissipate heat from electronic devices that are highly concentrated heat sources, such as microprocessors and computer chips. These electronic devices typically have power densities in the range of about 5 to 35 W/cm$^2$ and relatively small available space for placement of fans, heat exchangers, heat sink assemblies and the like. However, these electronic devices are increasingly being miniaturized and designed to achieve increased computing speeds that generate heat up to 200 W/cm$^2$.

Heat exchangers and heat sink assemblies have been used that apply natural or forced convection cooling methods to cool the electronic devices. These heat exchangers typically use air to directly remove heat from the electronic devices. However, air has a relatively low heat capacity. Such heat sink assemblies are suitable for removing heat from relatively low power heat sources with power density in the range of 5 to 15 W/cm$^2$. The increased computing speeds result in corresponding increases in the power density of the electronic devices in the order of 20 to 35 W/cm$^2$ thus requiring more effective heat sink assemblies.

In response to the increased heat to be dissipated, liquid-cooled units called LCUs employing a cold plate in conjunction with high heat capacity fluids, like water and water-glycol solutions, have been used to remove heat from these types of high power density heat sources. One type of LCU circulates the cooling liquid so that the liquid removes heat from the heat source, like a computer chip, affixed to the cold plate, and is then transferred to a remote location where the heat is easily dissipated into a flowing air stream with the use of a liquid-to-air heat exchanger and an air moving device such as a fan or a blower. These types of LCUs are characterized as indirect cooling units since they remove heat from the heat source indirectly by a secondary working fluid, generally a single-phase liquid, which first removes heat from the heat source and then dissipates it into the air stream flowing through the remotely located liquid-to-air heat exchanger. Such LCUs are satisfactory for moderate heat flux less than 35 to 45 W/cm$^2$ at the cold plate.

In the prior art heat sinks, such as those disclosed in U.S. Pat. Nos. 6,422,307 and 5,304,846, the single-phase working fluid of the liquid cooled unit (LCU) flows directly over the cold plate causing cold plate corrosion and leakage problems.

As computing speeds continue to increase even more dramatically, the corresponding power densities of the devices rise up to 200 W/cm$^2$. The constraints of the miniaturization coupled with high heat flux generated by such devices call for extremely efficient, compact, and reliable thermosiphon cooling units called TCUs. Such TCUs perform better than LCUs above 45 W/cm$^2$ heat flux at the cold plate. A typical TCU absorbs heat generated by the electronic device by vaporizing the captive working fluid on a boiler plate of the unit. The boiling of the working fluid constitutes a phase change from liquid-to-vapor state and as such the working fluid of the TCU is considered to be a two-phase fluid. The vapor generated during boiling of the working fluid is then transferred to an air-cooled condenser, in close proximity to the boiler plate, where it is liquefied by the process of film condensation over the condensing surface of the TCU. The heat is rejected into an air stream flowing over a finned external surface of the condenser. The condensed liquid is returned back to the boiler plate by gravity to continue the boiling-condensing cycle. These TCUs require boiling and condensing processes to occur in close proximity to each other thereby imposing conflicting thermal conditions in a relatively small volume.

Examples of cooling systems for electronic devices are disclosed in U.S. Pat. No. 4,704,658 to Yokouchi et al; U.S. Pat. No. 5,529,115 to Paterson and U.S. Pat. No. 5,704,416 to Larson et al.

SUMMARY OF THE INVENTION AND ADVANTAGES

In accordance with the subject invention, heat generated by an electronic device is transferred to the lower portion of a housing having a refrigerant therein for liquid-to-vapor transformation as coolant liquid flows through a plurality of flexible tubes in an upper portion of the housing to vary the volume of the tubes for modulating the flow of coolant liquid through the tubes in response to heat transferred by the electronic device to the lower portion of the housing.

The invention employs an array of flexible tubes to separate the secondary two-phase fluid from the single-phase working fluid of the LCU. The flexible tubes perform the useful function of changing the volume of the upper portion or boiling chamber depending on the chip heat flux. As the chip heat flux increases, the flexible tubes contract decreasing the tube volume thereby increasing the coolant flow velocity and the heat transfer. As the chip heat flux decreases, the flexible tubes expand increasing the tube volume thereby decreasing the coolant flow velocity and the heat transfer. Thus the flexible tubes continuously regulate the working fluid flow velocity through the tubes thereby adjusting the heat transfer rate in response to computer cooling demand.

The present invention utilizes a captive secondary fluid capable of undergoing liquid-to-vapor transformation within the boiling chamber to remove heat by ebullition from the cold plate. The resulting vapor surrounds the flexible tubes through which flows the working fluid of the TCU without coming in direct contact with the secondary fluid vapor. The secondary fluid vapor is condensed by the working liquid coolant flowing to the interior of the flexible tubes. Thus the boiling chamber with the secondary two-phase fluid functions as a thermosiphon with superincumbent flexible tubes with working fluid flowing them serving as the condenser tubes.

The heat transfer rate of the two-phase secondary fluid is inherently higher than that of the single-phase working fluid. Therefore, besides enhancing the cooling capacity of the TCU, the invention solves the problem of corrosion and leakage that plagues the LCU with highly aggressive working fluid flowing directly over the cold plate. The captive two-phase secondary fluid in direct contact with the cold plate is not as aggressive as the working fluid of the LCU.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENT

Figure 1:
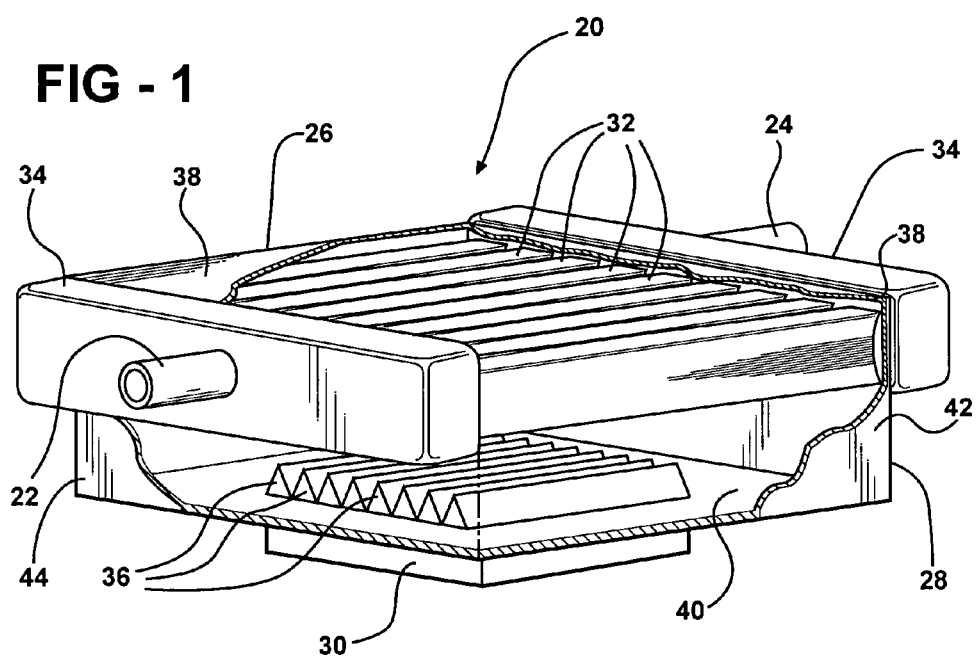
FIG. 1 is a perspective view of the heat exchanger of the subject invention showing the housing cutaway.
Figure 2:
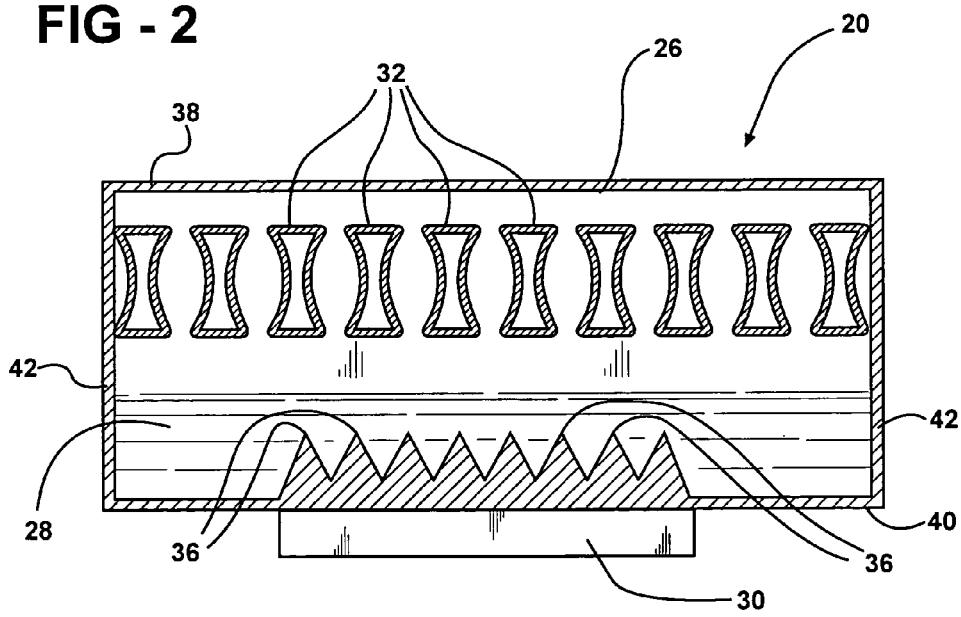
FIG. 2 is a cross sectional view of the heat exchanger shown in FIG. 1.

A fluid heat exchanger comprises a housing 20 having an inlet 22 and an outlet 24 and an upper portion 26 and a lower portion 28 extending between the inlet 22 and the outlet 24 for establishing a direction of flow from the inlet 22 to the outlet 24. The assembly is used to cool an electronic device 30 engaging or secured to the lower portion 28 of the housing 20, as by being adhesively held in a recess (not shown) in the bottom of the housing 20.

A plurality of tubes 32 extend between a pair of header tanks 34 in fluid communication with the inlet 22 and the outlet 24 for establishing a flow of coolant liquid from the inlet 22 to the outlet 24 in the upper portion 26 of the housing 20. The inlet 22 and outlet 24 header tanks 34 are in fluid communication with opposite ends of the tubes 32 for feeding coolant liquid to the various tubes 32 from the inlet 22 and for collecting coolant liquid from the various tubes 32 for feeding the coolant liquid to the outlet 24. In other words, the inlet 22 feeds cooling fluid into the header tank 34 at the inlet 22 of the housing 20 and the outlet 24 conveys the coolant away from the header tank 34 at the outlet 24 of the housing 20.

The housing 20 is hermetically sealed about the tubes 32 to contain a refrigerant in the lower portion 28 for liquid-to-vapor transformation. The tubes 32 are radially flexible to vary the volume of the tubes 32 for modulating the flow of coolant liquid through the tubes 32 in response to heat transferred by the electronic device 30 to the lower portion 28 of the housing 20. Each of the tubes 32 defines a cross section having a generally hour-glass shape with a waisted middle whereby the concave sides of each tube 32 move in and out in response to the pressure of coolant flow through the tubes 32. The tubes 32 may comprise a thin gage metal, although various materials may be utilized that are inert to the coolant and the refrigerant. For example, the tubes 32 may be made by impact extrusion like tooth paste containers.

A plurality of fins 36 extend from the bottom of the housing 20 for increasing heat transfer from the electronic device 30 to the interior of the lower portion 28 of the housing 20. The fins 36 extend linearly in the direction of flow under the tubes 32 and between the header tanks 34. The heat transfer fins 36 are disposed in the lower portion 28 of the housing 20 for transferring heat from the electronic device 30 disposed on the exterior of the lower portion 28 of the housing 20 by boiling the refrigerant in the lower portion 28 of the housing 20. The fins 36 could be of the type disclosed in U.S. Pat. No. 6,588,498.

The upper portion 26 of the housing 20 is generally rectangular and the lower portion 28 of the housing 20 is generally rectangular and the upper portion 26 has a larger periphery to overhang the lower portion 28 by the width of the header tanks 34. In other words, the housing 20 is generally a square in both the upper 26 and lower portions 28 but the header tanks 34 extend in one direction or along one axis from opposite sides of the upper portion 26 to overhang the lower portion 28. In other words, the upper portion 26 has the same footprint as the lower portion 28 except when the header tanks 34 are included with the upper portion 26, the upper portion 26 has a larger footprint than the lower portion 28 in one direction or along one axis. The housing 20 actually comprises a top wall 38 extending between the header tanks 34 and spaced from and over the tubes 32 and a bottom wall 40 to which the electronic element is adhesively attached. A pair of oppositely disposed side walls 42 extend vertically between the top wall 38 and the bottom wall 40 and spaced laterally from the side-most tubes 32 and a pair of oppositely disposed end walls 44 extend vertically between the bottom wall 40 and the bottoms of the header tanks 34. The joints between the various walls and between the side walls 42, the end walls 44 and the header tanks 34 are all hermetically sealed, as by brazing, or the like. The upper portion 26 of the housing 20 completely surrounds, i.e. is spaced from, the tubes 32 so that the tubes 32 are surrounded by refrigerant vapor.

Figure 3:
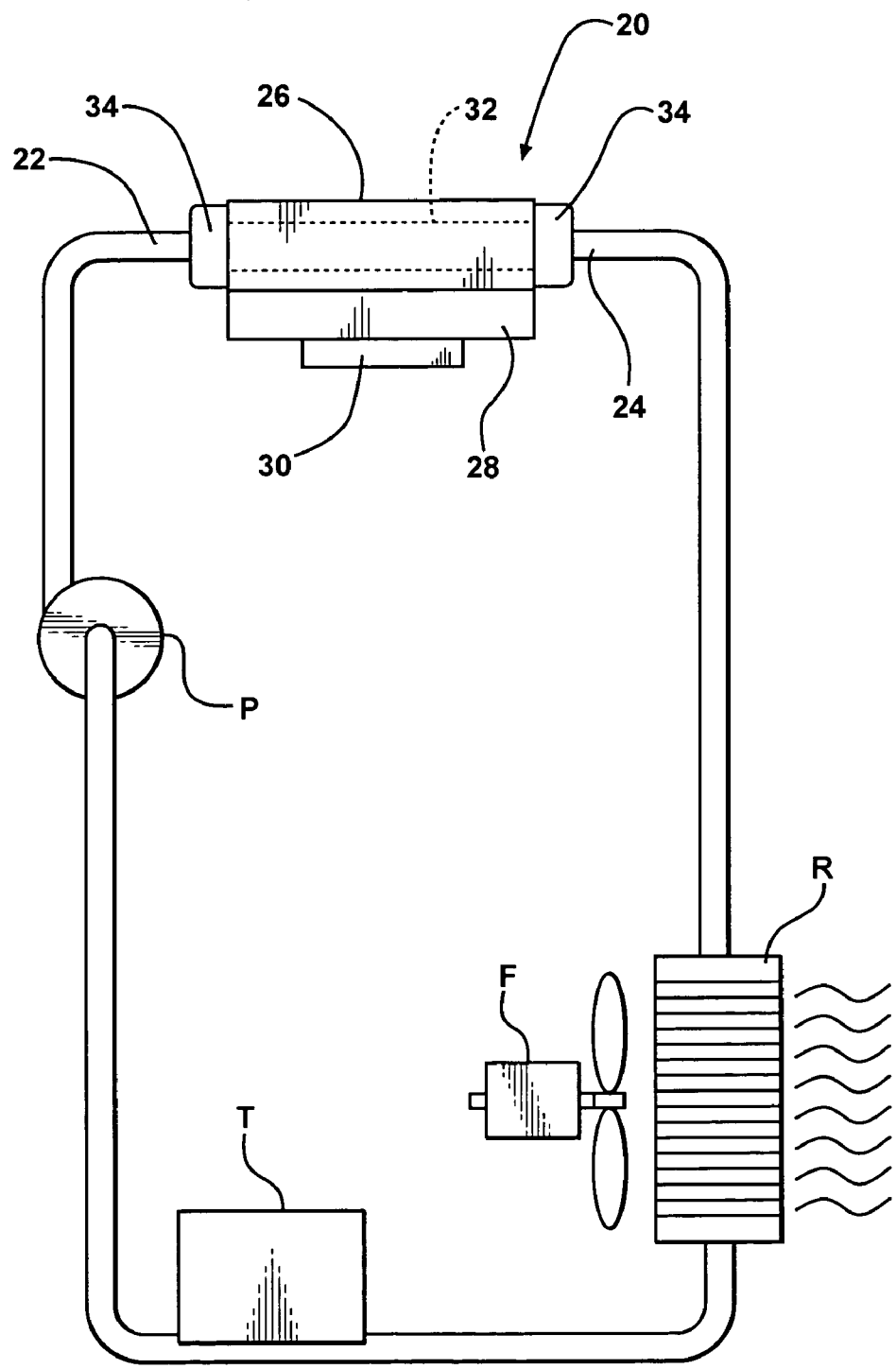
FIG. 3 is a schematic of a liquid cooling system in which the heat exchanger of the subject invention may be utilized.

The operation of the heat exchanger housing 20 is incorporated into a liquid cooling system as illustrated in FIG. 3. The electronic device 30 generates an amount of heat to be dissipated and the heat is transferred from the electronic device 30 to the bottom of the heat exchanger housing 20. The heat is then conducted from the bottom to the fins 36 and thence to the cooling fluid. A working fluid mover, such as a pump P, moves a fluid, usually a liquid, through a working fluid storage vessel T, that stores excess working fluid. The pump P moves the cooling fluid through a heat extractor or radiator assembly to dissipate heat from the cooling fluid, the heat extractor or radiator assembly including a fan F and radiator R. The radiator R can be of the well known type including tubes 32 with cooling fins 36 between the tubes 32 to exchange heat between the cooling fluid passing through the tubes 32 and air forced through the fins 36 by the fan F.

The invention therefore provides a method of cooling an electronic device 30 by disposing a refrigerant in the lower portion 28 of the housing 20 for liquid-to-vapor transformation and transferring the heat generated by the electronic device 30 to the lower portion 28 of a housing 20. The method is distinguished by flowing coolant liquid through the plurality of flexible tubes 32 in an upper portion 26 of the housing 20 and varying the volume of the tubes 32 for modulating the flow of coolant liquid through the tubes 32 in response to heat transferred by an electronic device 30 to the lower portion 28 of the housing 20.

Obviously, many modifications and variations of the present invention are possible in light of the above teachings. The invention may be practiced otherwise than as specifically described within the scope of the appended claims, wherein recitations should be interpreted to cover any combination in which the incentive novelty exercises its utility.

What is claimed is:

1. A fluid heat exchanger assembly for cooling an electronic device with a cooling fluid supplied from a heat extractor (R, F) and comprising;

a housing having an inlet and an outlet and an upper portion and a lower portion with said inlet and said outlet being in said upper portion, a plurality of tubes extending between said inlet and said outlet for establishing a flow of coolant liquid from said inlet to said outlet in said upper portion, said housing being hermetically sealed about said tubes, a refrigerant disposed in said housing for liquid-to-vapor transformation, each of said tubes defining a cross section having a generally hour-glass shape with a waisted middle and being radially flexible to vary the volume of said tubes for modulating the flow of coolant liquid through said tubes in response to heat transferred by an electronic device to said lower portion of said housing.

2. An assembly as set forth in claim 1 including inlet and outlet header tanks in fluid communication with opposite ends of said tubes.

3. An assembly as set forth in claim 1 wherein said tubes comprise a thin gage metal.

4. An assembly as set forth in claim 1 including heat transfer fins disposed in said lower portion of said housing for transferring heat from an electronic device disposed on the exterior of said lower portion of said housing.

5. An assembly as set forth in claim 1 wherein said upper portion of said housing is generally rectangular and said lower portion of said housing is generally rectangular and coextensive with said upper portion.

6. An assembly as set forth in claim 5 wherein said header tanks are disposed on opposite sides of said upper portion to overhang said lower portion.

7. An assembly as set forth in claim 1 wherein said upper portion of said housing surrounds said tubes so that said tubes are surrounded by vapor state of the refrigerant.

8. A method of cooling an electronic device comprising the steps of;

generating heat by an electronic device, transferring the heat generated by the electronic device to the lower portion of a housing, disposing a refrigerant in the lower portion of the housing for liquid-to-vapor transformation, and flowing coolant liquid through a plurality of radially flexible tubes in an upper portion of the housing, said tubes defining a cross section having a generally hour-glass shape with a waisted middle and radially flexing to vary the volume of the tubes for modulating the flow of coolant liquid through the tubes in response to heat transferred by an electronic device to the lower portion of the housing.

* * * * *